United States Patent
Ema

[11] Patent Number: 5,874,332
[45] Date of Patent: Feb. 23, 1999

[54] SEMICONDUCTOR MEMORY DEVICE HAVING A MEMORY CELL CAPACITOR AND A FABRICATION PROCESS THEREOF

[75] Inventor: Taiji Ema, Kawasaki, Japan

[73] Assignee: Fujitsu Limited, Kanagawa, Japan

[21] Appl. No.: 683,543

[22] Filed: Jul. 15, 1996

Related U.S. Application Data

[62] Division of Ser. No. 385,470, Feb. 8, 1995, abandoned, which is a division of Ser. No. 296,594, Aug. 29, 1994, Pat. No. 5,414,636, which is a continuation of Ser. No. 894,605, Jun. 5, 1992, abandoned.

[30] Foreign Application Priority Data

| Jun. 7, 1991 | [JP] | Japan | 3-136544 |
| Oct. 30, 1991 | [JP] | Japan | 3-285088 |

[51] Int. Cl.$^6$ ............................................... H01L 21/8242
[52] U.S. Cl. ............................................ 438/239; 438/253
[58] Field of Search ................................... 438/238–254, 438/381–398

[56] References Cited

U.S. PATENT DOCUMENTS

| Re. 32,090 | 3/1986 | Jaccodine et al. . |
| 4,056,811 | 11/1977 | Baker . |
| 4,576,479 | 3/1986 | Downs . |
| 4,631,686 | 12/1986 | Ikawa et al. . |
| 4,636,985 | 1/1987 | Aoki et al. . |
| 4,679,171 | 7/1987 | Logwood et al. . |
| 4,694,205 | 9/1987 | Shu et al. . |
| 4,732,485 | 3/1988 | Morita et al. . |
| 4,751,557 | 6/1988 | Sunami et al. . |
| 4,791,616 | 12/1988 | Taguchi et al. . |
| 4,799,193 | 1/1989 | Horiguchi et al. . |
| 4,827,449 | 5/1989 | Inoue . |
| 4,958,318 | 9/1990 | Harari . |
| 5,075,890 | 12/1991 | Itoh et al. . |
| 5,136,533 | 8/1992 | Harari . |
| 5,155,059 | 10/1992 | Hieda . |
| 5,166,904 | 11/1992 | Hazani . |
| 5,208,176 | 5/1993 | Ahmad et al. . |
| 5,234,858 | 8/1993 | Fazan et al. . |
| 5,298,775 | 3/1994 | Ohya . |

FOREIGN PATENT DOCUMENTS 0 423 814  4/1991  European Pat. Off. .

OTHER PUBLICATIONS

Masouka, F., "Are You Ready for Next Generation Dynamic RAM Chips?", *IEEE Spectrum*, vol. 27, No. 11, Nov. 1980, pp. 110–112.

Mano et al., "Submicron VLSI Memory Circuits,", IEEE International Solid State Circuits Conference, *Digest of Technical Papers*, Feb. 25, 1983, pp. 233–235.

European Search Report, The Hague, Sep. 7, 1993.

*Primary Examiner*—Jey Tsai
*Attorney, Agent, or Firm*—Staas & Halsey

[57] ABSTRACT

A method for fabricating a dynamic random access memory comprises the steps of determining a design rule for word lines and bit lines and further for a pattern that extends from a memory cell array region to a peripheral region across a stepped boundary, determining a step height of the stepped boundary based upon the design rule, determining a capacitance of the memory cell capacitor based upon the step height of the stepped boundary, determining a parasitic capacitance of a bit line such that a ratio of the parasitic capacitance to the capacitance of the memory cell is smaller than a predetermined factor, and determining the number of the memory cells that are connected to one bit line based upon the parasitic capacitance of the bit line.

6 Claims, 10 Drawing Sheets

SEMICONDUCTOR MEMORY DEVICE HAVING A MEMORY CELL CAPACITOR AND A FABRICATION PROCESS THEREOF

This application is a division of U.S. application Ser. No. 08/385,470, filed Feb. 8, 1995, now abandoned, which is a division of allowed application Ser. No. 08/296,594, filed Aug. 29, 1994, now U.S Pat. No. 5,414,636, which is a continuation of U.S. application Ser. No. 07/894,605, filed Jun. 5, 1992, now abandoned.

BACKGROUND OF THE INVENTION

The present invention generally relates to semiconductor devices, and more particularly to a semiconductor memory device fabricated according to a submicron design rule. Particularly, the present invention relates to a dynamic random access memory that has a storage capacity of 256 Mbits or more.

The dynamic random access memories (DRAMs) are characterized by the simple device structure in that the device typically includes only a single memory cell capacitor for storing information and a single transfer gate transistor connected to the memory cell capacitor. Thus, the device can be fabricated easily with a large integration density and is suitable for constructing a semiconductor memory having a large storage capacity. Currently, the devices having a storage capacity of 256 Mbits or 1 Gbits are studied intensively.

In order to fabricate the large-scale DRAMs having a large number of memory cells assembled therein, various efforts have been made so far. Such efforts of course include the development of the submicron patterning processes that are applicable to the fabrication of the DRAMs having extremely minute memory cells. Particularly, the development of optical lithography applicable to the submicron patterning is essential for the mass production of DRAMs.

At the same time, a considerable effort has been devoted for securing a sufficient capacitance for the memory cell capacitors while reducing the size of the memory cells simultaneously. It should be noted that the reduction in the size of the memory cell capacitor generally invites a reduction in the capacitance of the memory cell. In the DRAMs, the capacitance of the memory cell capacitors is required to be larger than the parasitic capacitance of the bit lines by a predetermined factor.

More specifically, the total electric charges that are stored on a bit line as well as in a memory cell capacitor cooperating with the bit line are represented as $$C_B \cdot V_B + C_S \cdot V_S = (C_B + C_S) \cdot V, \quad (1)$$

where $C_B$ represents the capacitance of the bit line, $C_S$ represents the capacitance of the memory cell capacitor, $V_B$ represents the bit line voltage in the state that the transfer gate transistor which connects the memory cell capacitor and the bit line is turned off, $V_S$ represents the voltage on the memory cell capacitor, and $V$ represents the bit line voltage in the state that the transfer gate transistor is turned on. Using the above relationship, the voltage change $_A V$ that appears on the bit line in response to the turning-on and turning-off of the transfer gate transistor is represented as $$_A V = V - V_B = (V_S - V_B)/(1 + C_B/C_S). \quad (2)$$

It should be noted that this voltage change $_A V$ is detected by the sense amplifier that typically has a flip-flop construction. In order to achieve a reliable reading, it is necessary to maximize the voltage change $_A V$, and for this purpose, it is necessary to set the capacitance $C_S$ of the memory cell as large as possible as compared with the parasitic capacitance $C_B$.

In order to maximize the capacitance $C_S$ in the memory cells that are fabricated in accordance with the submicron design rule, the inventor of the present invention has previously proposed a memory cell wherein the memory cell capacitor has a stacked structure (T. Ema, Technical Proc. SEMICON/JAPAN 1990, pp.184–193). In this proposal, the memory cell capacitor is formed into a stacked fin structure wherein a number of thin electrodes are stacked with each other with a thin dielectric film interposed therebetween. Further, the memory cell has the so-called shielded bit line structure (SBL) wherein an electrode plate is provided above the memory cell capacitor to extend over the bit line as an opposing electrode of the capacitor. Thereby, the capacitance of the memory cell capacitor is increased significantly with the increased surface area, without increasing the height or aspect ratio of the memory cell capacitor.

Figure 1:
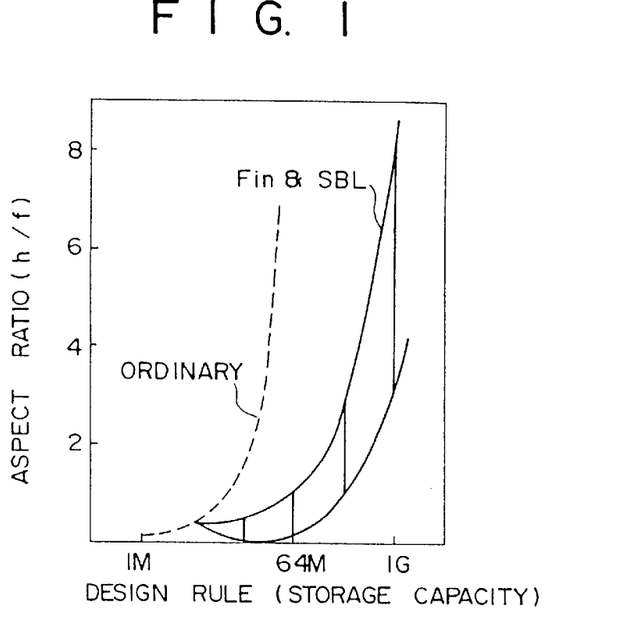
FIG. 1 is a diagram showing the relationship between a storage capacity and the aspect ratio of a memory cell capacitor used for a DRAM.

FIG. 1 shows the relationship between the aspect ratio and the design rule represented in terms of the storage capacity of the DRAM, for a device having the stacked fin structure in the memory cell capacitor, in comparison with a device that has an ordinary structure for the memory cell capacitor. In both the stacked fin memory cell capacitor and the ordinary memory cell capacitor, a capacitance of 25 fF is assumed. The aspect ratio is defined as a ratio of the height (h) of the memory cell capacitor divided by the spacing (f) between the memory cells. From FIG. 1, it will be noted that the aspect ratio of the stacked fin memory cell capacitor remains substantially the same when the design rule has been changed from 4 Mbits to 64 Mbits. On the other hand, the aspect ratio of the ordinary memory cell capacitor increases steeply when the design rule has been changed such that the storage capacity increases beyond 4 Mbits.

FIG. 1 further indicates that the aspect ratio starts to increase steeply even in the stacked fin memory cell capacitor, when the storage capacity is increased beyond 256 Mbits. With the increase of the aspect ratio, it will be noted that height of the memory cell capacitor generally increases. Such an increase of the height of the memory cell capacitor occurs inevitably in the DRAMs of high integration density wherein further reduction of the spacing between the memory cells is difficult.

Figure 2:
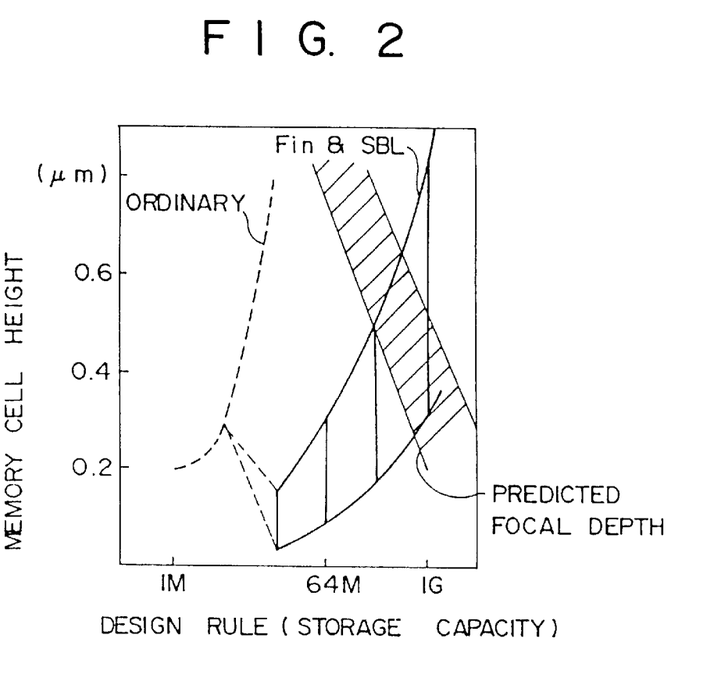
FIG. 2 is a diagram showing the relationship between the height of the memory cell capacitor and the storage capacity for a DRAM.

FIG. 2 shows such an increase of the height of the memory cell capacitor. In this case, too, a capacitance of 25 fF is assumed for the both types of capacitors. From FIG. 2, it will be noted that the height of the memory cell capacitor decreases suddenly at 16 Mbits in correspondence to the employment of the stacked fin structure. With further increase in the strictness of the design rule, the height of the memory cell capacitor increases steeply as indicated in FIG. 2. This means that the memory cell array region of the DRAM has a substantially increased height as compared with the peripheral region where the peripheral devices such as decoders, sense amplifiers, input/output buffers, etc. are provided.

In such a memory device having a substantial step height between the memory cell array region and the peripheral region, it will be noted that the exposure of the conductor pattern that extends between the memory cell array region and the peripheral region is difficult, particularly when an optical exposure system having a large numerical aperture (N.A.) is employed. It should be noted that a large numerical aperture is essential for the optical exposure system for achieving the exposure with high resolution, while such a large numerical aperture simultaneously invites a substantial reduction of the focal depth. In other words, the high resolution optical exposure system that is employed for the photolithographic patterning process of the DRAMs generally has an extremely limited focal depth, and the simultaneous exposure of the conductor pattern on the memory cell array region and the conductor pattern on the peripheral region is impossible. This in turn means that the exposure of the conductor strips that extend continuously between the memory cell array region and the peripheral region is totally impossible. It should be noted that the formation of such a conductor pattern is essential in the ASIC chips wherein a memory cell array and a logic device are assembled on a common chip surface.

In FIG. 2, the focal depth of the optical system that is used for fabricating the device is also illustrated. As can be seen in the drawing, the focal depth decreases generally linearly with the increased integration density and intersects with the curve that represents the height of the memory cell capacitor. In FIG. 2, the focal depth is drawn with the same scale as the height of the memory cell. It should be noted that in the region where the focal depth is larger than the step height, the exposure of the device can be achieved without problem. On the other hand, when the line representing the focal depth intersects with the curve representing the step height, the exposure becomes difficult. This problem becomes conspicuous at the design rule of 256 Mbits to 1 Gbits.

The foregoing results of FIGS. 1 and 2 indicate that even when the stacked fin memory cell capacitor is employed in combination with the shielded bit line structure, there appears a limitation in the miniaturization at the storage capacity of about 256 Mbits. The fabrication of the device having an integration density exceeding this limit is generally impossible, as long as such a conventional device structure that requires the large size memory cell capacitor is employed. This in turn indicates that, in order to realize a DRAM that has the storage capacity exceeding the foregoing limit, it is inevitable to reduce the height and hence the size of the memory cell capacitor.

Conventionally, it is known that the capacitance of a dielectric capacitor can be increased when the thickness of a dielectric film that forms the capacitor is decreased. Thus, one may think that the necessary capacitance may be secured even when the height of the memory cell capacitor is reduced, provided that the thickness of the dielectric film formed on the electrode fins is reduced.

Figure 3:
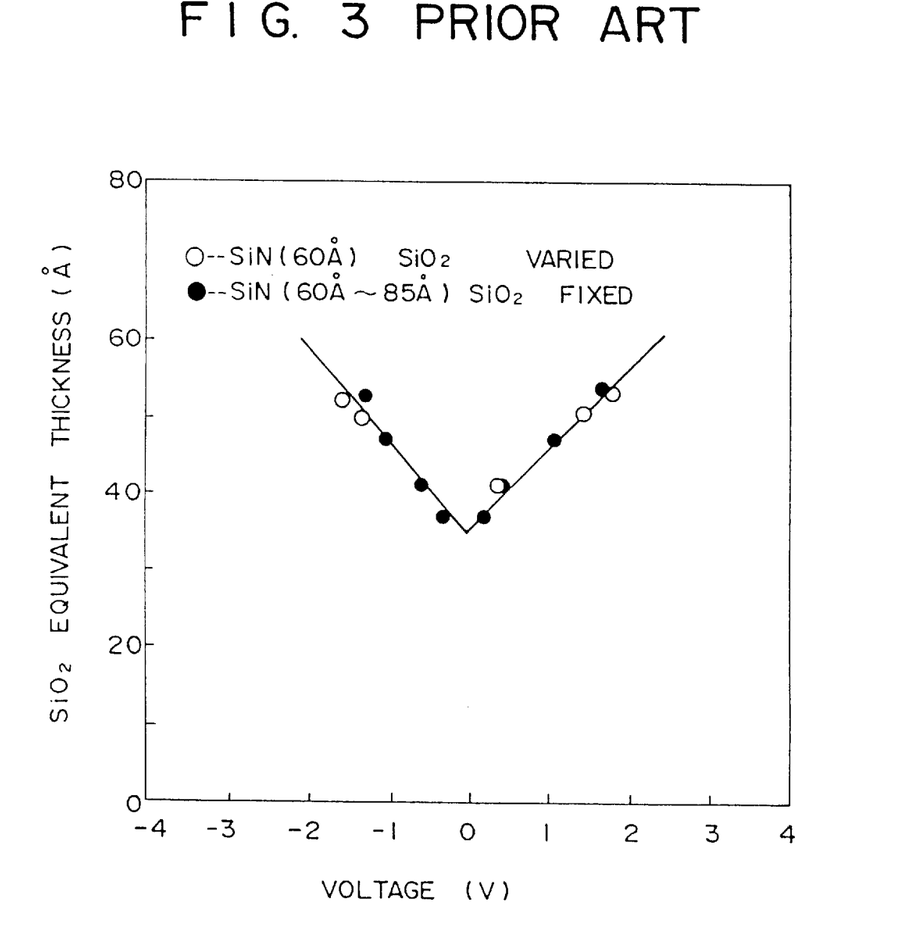
FIG. 3 is a diagram showing the relationship between the thickness of a dielectric film and the voltage applied across the electrodes that form a capacitor together with the dielectric film.

FIG. 3 shows a relationship between the thickness of a dielectric film and a maximum voltage that can be applied across a pair of electrodes that form a capacitor, with the dielectric film interposed therebetween. There, the thickness of the dielectric film is represented in terms of the thickness of a silicon oxide film, while the actual measurement was made for a composite film of silicon oxide and silicon nitride. In FIG. 3, the open circles represent the result for the case wherein the silicon nitride film having a thickness of 60 Å is oxidized with various lengths of the oxidation process. On the other hand, the solid circles represent the result for the case wherein a silicon nitride film having a thickness in the range between 60 Å and 85 Å is oxidized for a predetermined duration. It should be noted that the relationship represented in FIG. 3 corresponds to the condition wherein a leak current of $10^{-8}/cm^2$ flows through the dielectric film. It should be noted that this level of $10^{-8}/cm^2$ defines the upper tolerable limit for a memory cell capacitor to retain the information stably.

Referring to FIG. 3, it will be noted that the voltage corresponding to the foregoing leak current of $10^{-8}/cm^2$ decreases generally with decreasing thickness of the dielectric film. On the other hand, it should be noted that the leak current flows through the dielectric film even when the voltage is reduced to zero, when the thickness of the dielectric film is reduced below about 35 Å. It should be noted that such a leak current flows due to the direct tunneling effect of the electrons. In other words, the result of FIG. 3 indicates that the physical law prohibits the reduction of the thickness of the dielectric film below several nanometers. When a supply voltage $V_{CC}$ of 3.3 volts is assumed, the thickness of the dielectric film cannot be reduced below 50–60 Å.

In designing the memory cell capacitor, it is further necessary to keep in mind the lower limit of the thickness of the polysilicon layer. When the thickness is smaller than 50–100 Å, it is known that the polysilicon layer cannot be grown uniformly. Assuming the thickness of the polysilicon layer of 50 Å and the thickness of the dielectric film of 50 Å, it should be noted that the thickness of a single fin electrode has to be larger than 20 nm (=5 nm+2×5 nm+5 nm). When the tolerance for fabrication is taken into consideration, it is preferred that the fin electrode has a thickness of 30 nm or more. When such an electrode fin is stacked for securing sufficient capacitance, the height of the memory cell capacitor increases inevitably.

In such a situation, it is inevitable to reduce the capacitance of the memory cell capacitor in order to realize the DRAMs that have the storage capacity exceeding 256 Mbits. However, there is a limitation in the reduction of the capacitance of the memory cells as already noted with reference to Eqs.(1) and (2).

SUMMARY OF THE INVENTION

Accordingly, it is a general object of the present invention to provide a novel and useful semiconductor memory device and a fabrication process thereof, wherein the foregoing problems are eliminated.

Another and more specific object of the present invention is to provide a dynamic random access memory having a large storage capacity exceeding 256 Mbits, wherein a stable read/write operation is guaranteed.

Another object of the present invention is to provide a dynamic random access memory, comprising a memory cell array including a plurality of memory cells, said memory cell array being divided into a plurality of memory cell sub-arrays each including said memory cells that are arranged into a plurality of rows and a plurality of columns, each of said memory cells comprising a memory cell capacitor having a predetermined capacitance and a transfer gate transistor connected to said memory cell capacitor a plurality of bit lines provided in each memory cell sub-array in correspondence to said columns of memory cells, each of said bit lines being connected commonly to a plurality of memory cells that are included in a column of the memory cells that corresponds to said bit line and a plurality of word lines provided in each memory cell sub-array in correspondence to said rows of memory cells, each of said word line being connected commonly to a plurality of memory cells that are included in a row of the memory cells that corresponds to said word line. The dynamic random access memory also comprises decoding means supplied with address data addressing a selected memory cell for selecting a bit line and a word line to which said selected memory cell is connected; read/write means for reading and/or writing data from and to said selected memory cell via said selected bit line; each of said bit lines extending for a distance determined such that the number of the memory cells that are connected to said bit line is equal to or smaller than 128. According to the present invention, it is possible to suppress the parasitic capacitance of the bit lines substantially smaller than the capacitance of the memory cell as a result of the reduction in the capacitance of each bit line, and a reliable reading of data from the memory cell becomes possible.

Another object of the present invention is to provide a method for fabricating a dynamic random access memory, said dynamic random access memory comprising, a memory cell array region that includes therein a plurality of memory cells, each of said memory cells including a memory cell capacitor, said memory cell array region having a first surface level; and a peripheral region that has a second surface level lower than said first surface level, said memory cell array region and said peripheral region being bounded from each other by a stepped boundary. The method comprises the steps of: (a) determining a design rule that specifies a smallest pattern width that is used in the dynamic random access memory, with respect to word lines and bit lines forming the dynamic random access memory and further with respect to a pattern that extends from said memory cell array region to said peripheral region across said stepped boundary; (b) determining a step height of said stepped boundary based upon said design rule determined in said step (a); (c) determining a capacitance of the memory cell capacitor based upon said step height of the stepped boundary that is determined in said step (b); (d) determining a parasitic capacitance of said bit line such that a ratio of said parasitic capacitance to said capacitance of the memory cell is smaller than a predetermined factor; and (e) determining the number of the memory cells that are connected to one bit line based upon said parasitic capacitance of the bit line determined in said step (d).

According to the present invention, the number of memory cells that are connected to one bit line decreases with increasing strictness of the design rule. As the extension of the bit lines in each memory cell sub-array decreases with the increase of the integration density, the effect of the parasitic capacitance of the bit line is decreased substantially as compared with the capacitance of the memory cell. Thereby, a reliable reading operation is possible even when the device has a storage capacity of 256 Mbits or more. It should be noted that the number of memory cells and hence the extension of the bit lines are not necessarily reduced significantly with the increase of strictness of the design rule, and the parasitic capacitance of the bit lines decreases with the integration density. Thus, the number of the memory cells connected to the bit line is reduced while maintaining a predetermined relationship with respect to the extension of the bit line and hence the integration density.

Other objects and further features of the present invention will become apparent from the following detailed description when read in conjunction with the attached drawings.

DETAILED DESCRIPTION OF THE PREFERRED EMBODIMENTS

Figure 4:
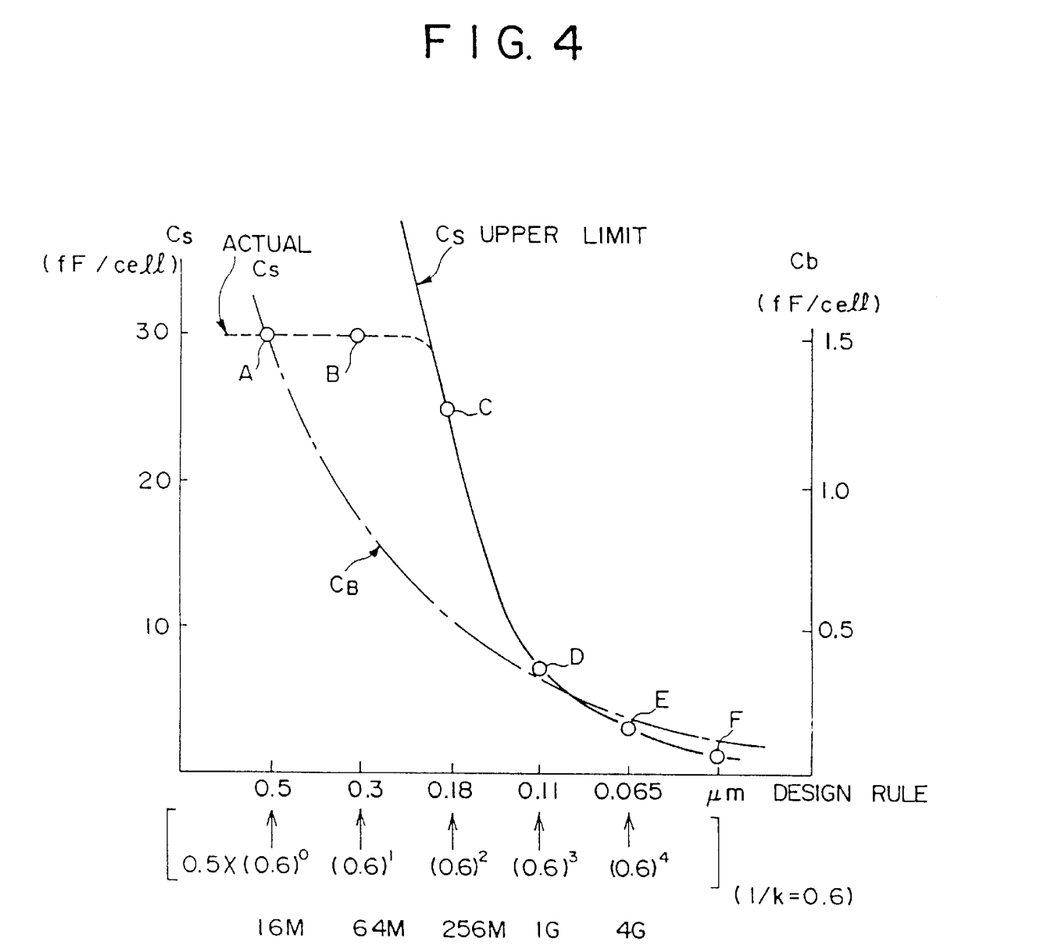
FIG. 4 is a diagram showing the relationship between the capacitance of the memory cell capacitor and the storage capacity of a DRAM in comparison with the parasitic capacitance of a bit line.
Figure 5:
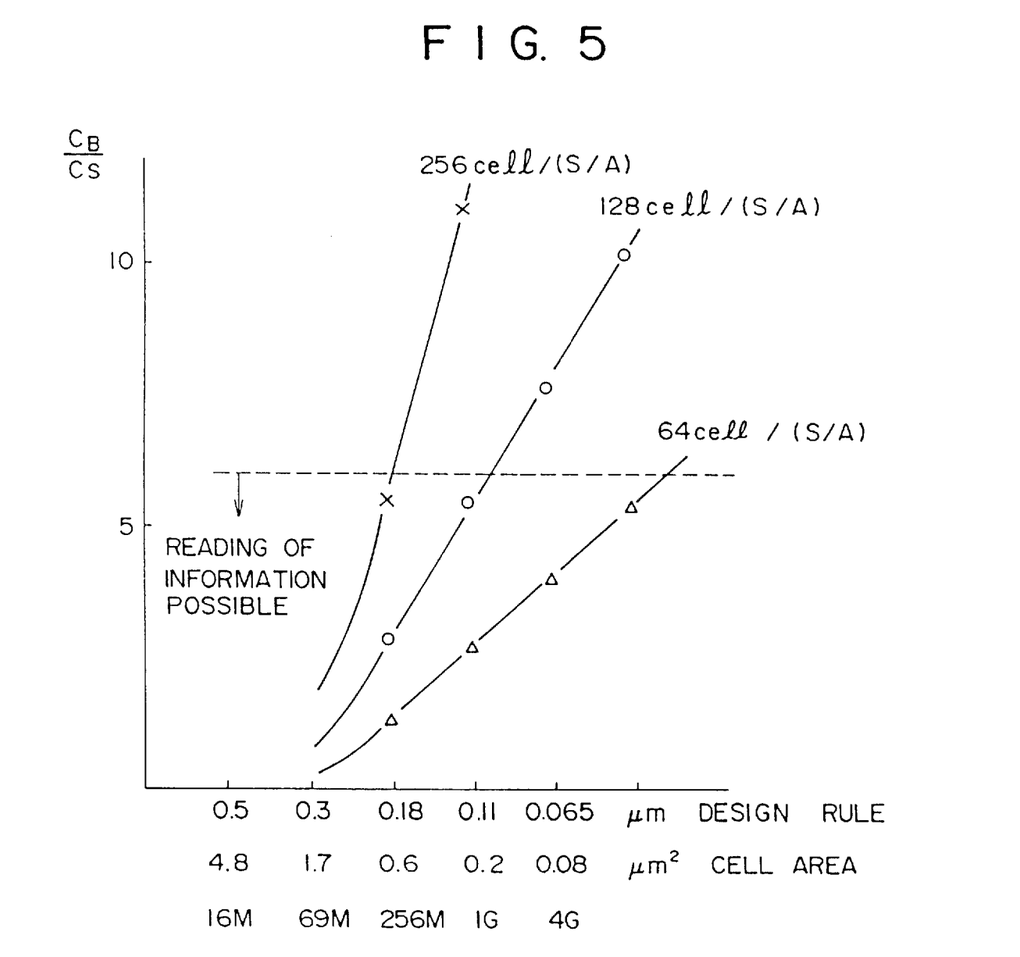
FIG. 5 is a diagram explaining the principle of the present invention for showing the optimum number of memory cells that are connected to the bit line.

First, the principle of the present invention will be described with reference to FIGS. 4 and 5, wherein FIG. 4 shows the capacitance $C_S$ of the memory cell capacitor as well as the parasitic capacitance $C_B$ of the bit line as a function of the design rule, while FIG. 5 shows the relationship between the ratio $C_B/C_S$ and the design rule for various numbers of the memory cells that are connected to the bit line. It should be noted that the relationship represented in FIGS. 4 and 5 are obtained for the DRAMs that have the fin electrode structure for the memory cells and the shielded bit line structure for the bit lines as will be described later with reference to FIGS. 7 and 8.

Referring to FIG. 4, the points A, B, C, D, E and F correspond to the design rules respectively for the 16 Mbit DRAM, 64 Mbit DRAM, 256 Mbit DRAM, 1 Gbit DRAM, and 4 Gbit DRAM. There, the scaling factors of $(1/k)^0$, $(1/k)^1$, $(1/k)^2$, $(1/k)^3$, $(1/k)^4$ are employed for the 16 Mbit device, 64 Mbit device, 256 Mbit device, 1 Gbit device, and 4 Gbit device respectively, where the parameter 1/k is set to 0.6.

In FIG. 4, it will be noted that the parasitic capacitance $C_B$ of the bit lines decreases with the increasing strictness of the design rule. Here, the design rule changes from 0.5 µm for the 16 Mbit device to 0.065 µm for the 4 Gbit device in correspondence to the scaling factor of $(1/k)^n$ as mentioned above. Using the scaling factor $1/k$, the parasitic capacitance $C_{bk}$ of the bit line for one memory cell decreases according to the relationship $$C_{bk} = C_b \cdot (1/k) \cdot (1/k)/(1/k) \qquad (3)$$
$$= C_b \cdot (1/k)$$

where $C_b$ represents the bit line capacitance per memory cell ($C_B = N \cdot C_b$; N = number of memory cells per a bit line). The above relationship corresponds to the scaling law of the bit line capacitance that is represented as $$C_b \propto [\text{bit line length per cell}] \times [\text{bit line width}]/[\text{dielectric film thickness}] \quad (4)$$

On the other hand, the memory cell capacitance $C_S$ is represented as $$C_S \propto \{(\text{electrode area}) \times 2 + (\text{electrode peripheral length}) \times \quad (5)$$

$$(\text{fin thickness})\} \times (\text{fin number})/(\text{dielectric film thickness}).$$

In correspondence to this relationship, the memory cell capacity $C_{Sk}$ for the design rule of 1/k is represented as $$C_{Sk} \leq C_S \times \{(1/k)^2 + (1/k)\}. \quad (6)$$

This relationship indicates that the memory cell capacitance $C_{Sk}$ changes as a function of the square of (1/k). In other words, the memory cell capacitance $C_S$ decreases more quickly than the bit line capacitance $C_b$ with increasing strictness of the design rule. See the points C–F. This in turn indicates that, in order to secure a sufficient ratio $C_B/C_S$ for the DRAMs having the storage capacity of 256 Mbits or more, one may decrease the number N of the memory cells that are connected to the bit line. It should be noted that $C_B$ is represented as $C_B = C_b \cdot N$. It should be noted that such a problem has not occurred in the conventional 16 Mbit or 64 Mbit DRAMs where the capacitance of 30 fF/cell is secured as indicated by the points A and B.

FIG. 5 shows the relationship between the ratio $C_B/C_S$ and the design rule for various number N of the memory cells that are connected to the bit line. It will be noted that the ratio $C_B/C_S$ increases steeply with the increasing strictness of the design rule. In order to guarantee the reliable reading operation of the sense amplifier connected to the bit line, it is necessary to set the ratio $C_B/C_S$ to be smaller than a value of about 6. This imposes an upper limit in the number of the memory cells that are connected to the bit line. For example, in the DRAMs having the storage capacity of 256 Mbits, the number of the memory cells cannot exceed 256 per one bit line or one sense amplifier. In the DRAMs having the storage capacity of 1 Gbits, on the other hand, the number of the memory cells cannot exceed 128 per bit line or one sense amplifier. The present invention achieves the DRAMs having the storage capacity exceeding 256 Mbits by suitably choosing the length of each bit line connected to a sense amplifier and hence the number of the memory cells connected to each bit line based upon the relationship shown in FIG. 5.

Figure 6:
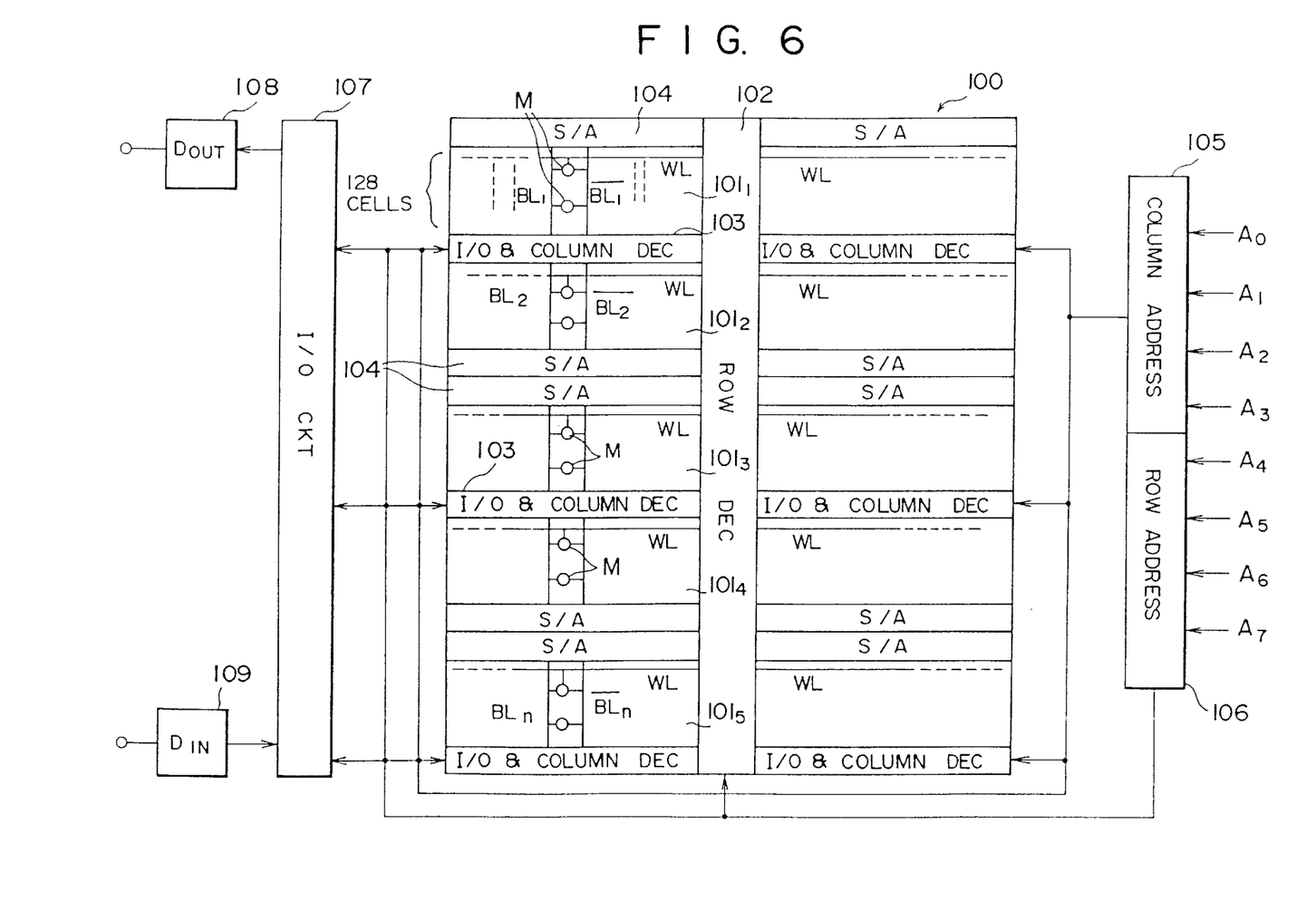
FIG. 6 is a block diagram showing the overall construction of the dynamic random access memory according to a first embodiment of the present invention.

Next, a first embodiment of the DRAM according to the present invention will be described with reference to FIG. 6 showing the overall construction of the device.

Referring to FIG. 6, the DRAM of the present invention includes a memory cell array 100 that includes a number of memory cells M. There, the memory cell array 100 is divided into a number of memory cell sub-arrays $101_i$ (i=1, 2, 3 . . . ), wherein each memory cell sub-array, such as the sub-array $101_1$, includes the memory cells M arranged in the row and column formation. Further, a row decoder 102 is provided to extend vertically in the drawing in the memory cell array 100 in correspondence to all of the sub-arrays.

In each memory cell sub-array $101_i$, there is provided a complementary bit line in correspondence to each column of the memory cells, wherein each complementary bit line includes a pair of bit lines BL and /BL for carrying complementary electric signals. Further, each memory cell sub-array includes a word line WL connected to the row decoder 102 in correspondence to each row of the memory cells as usual. In addition, each memory cell sub-array includes a column decoder 103 supplied with column address data for selecting a bit line, and a sense amplifier 104 connected to the complementary bit line BL, /BL for detecting the electric signals supplied thereto from the selected memory cell M.

It should be noted that the bit lines BL and /BL extend only for a limited length in correspondence to the division of the memory cell array into the memory cell sub-arrays. In other words, the bit lines BL and /BL in the memory cell sub-array has a length that is substantially shorter than the bit lines in the ordinary memory cell array. In correspondence to the limited length of the bit lines, the bit line capacitance $C_B$ is reduced substantially. Thereby, the number of the memory cells that are connected to the bit line is limited according to the relationship shown in FIG. 5. Thus, when the device is the DRAM having the storage capacity of 1 G bits, the number of memory cells connected to each complementary bit line in each memory cell sub-array is set to 128 as illustrated. When the device has the storage capacity of 256 Mbits, on the other hand, the number of the memory cells is set to 256. By reducing the number of the memory cells per bit line as such, it is possible to reduce the capacitance of the memory cells while guaranteeing the stable reading of data by the sense amplifier. Thereby, the height of the memory cell capacitor can be reduced, and the step height formed between the memory cell array region and the peripheral region is decreased accordingly. This feature will be explained in more detail with reference to FIG. 8.

FIG. 6 further shows a column address buffer 105 and a row address buffer 106 respectively supplied with address data $A_0$–$A_7$ for extracting therefrom the column address data to be supplied to the column decoder 103 and the row address data to be supplied to the row decoder 102. Further, there is provided an input/output circuit 107 connected to the column decoder 103 of each memory cell sub-array for interfacing the same against an output buffer 108. The circuit 107 is used also for the interface between an input buffer 109 and the column decoder 103. As usual in the DRAMs, the column decoder 103 includes an input/output part for supplying data to be written to the memory cell via the selected bit line in the form of electric signals and further for outputting the electric signal on the selected bit line to the output buffer 108.

Figure 7:
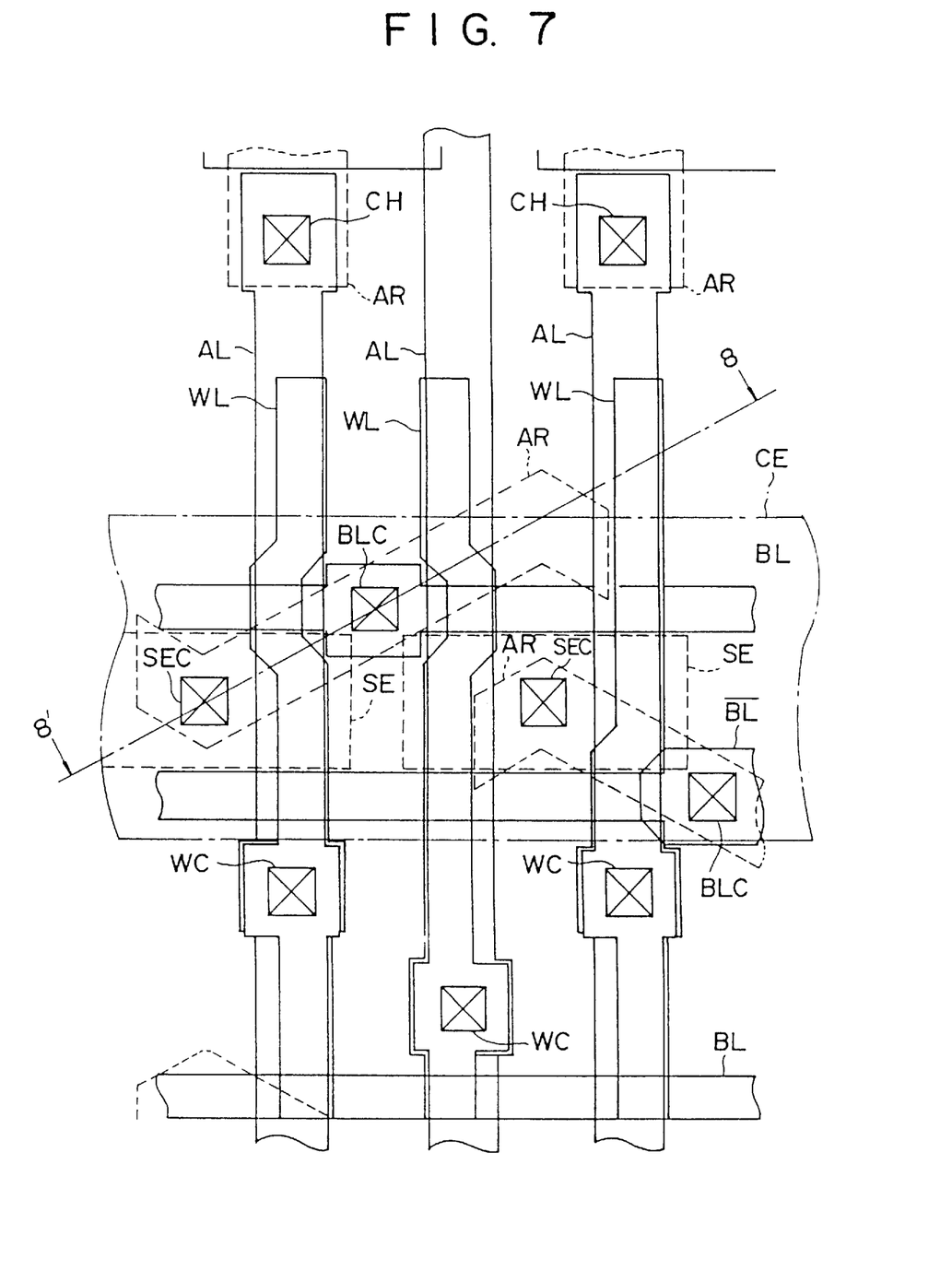
FIG. 7 is a diagram showing the essential part of the dynamic random access memory of FIG. 6 in the plan view.

FIG. 7 shows the structure of the memory cell used in the device of FIG. 6 in the plan view. This structure is the one that has been proposed previously by the inventor of the present invention (Ema, T., op. cit.). Therefore, the description will be made only briefly.

Referring to FIG. 7, there is provided an active region AR as a window formed in a field oxide film 12 that covers a semiconductor substrate 10. See the cross sectional view of FIG. 8. On the surface of the substrate, there is provided a word line WL of polysilicon to extend vertically in the drawing over the active region AR, and diffusion regions acting as the source and the drain of a MOS transistor is formed in the substrate at both sides of the word line WL. Thereby, the word line WL acts as the gate electrode as usual, and the MOS transistor forms the transfer gate transistor. As usual, the transfer gate transistor allows the passage of electrical signals between the memory cell capacitor and the bit line when turned on in response to the selection signal on the word line WL. In correspondence to the source region of the MOS transistor, there is provided a contact hole BLC in an insulation layer 18 to be described later with reference to FIG. 8, and a polysilicon bit line BL that extends laterally above the word line WL establishes an electrical contact with the exposed source region. On the other hand, there is formed a contact hole SEC in the insulation layer 18 in correspondence to the drain region of the transfer gate transistor, and a memory cell capacitor SE having the stacked fin structure is provided in contact with the drain region via the contact hole SEC. Further, there is provided an electrode plate CE to cover the surface of an insulation film (not shown) that in turn covers the memory cell capacitor SE. Thereby, the electrode plate CE acts as the opposing electrode of the stacked memory cell capacitor SE.

The entire structure is buried under an insulation layer 28 (see FIG. 8), and there is provided a shunt word line AL of aluminum on the upper major surface of the insulation layer 28 to extend vertically in the drawing in correspondence to the word line WL for reducing the resistance of the polysilicon word line. The shunt word line AL is connected to the word line WL at a contact hole WC provided through the insulation layer 28. Thereby, the resistance of the word line WL is substantially reduced.

Figure 8:
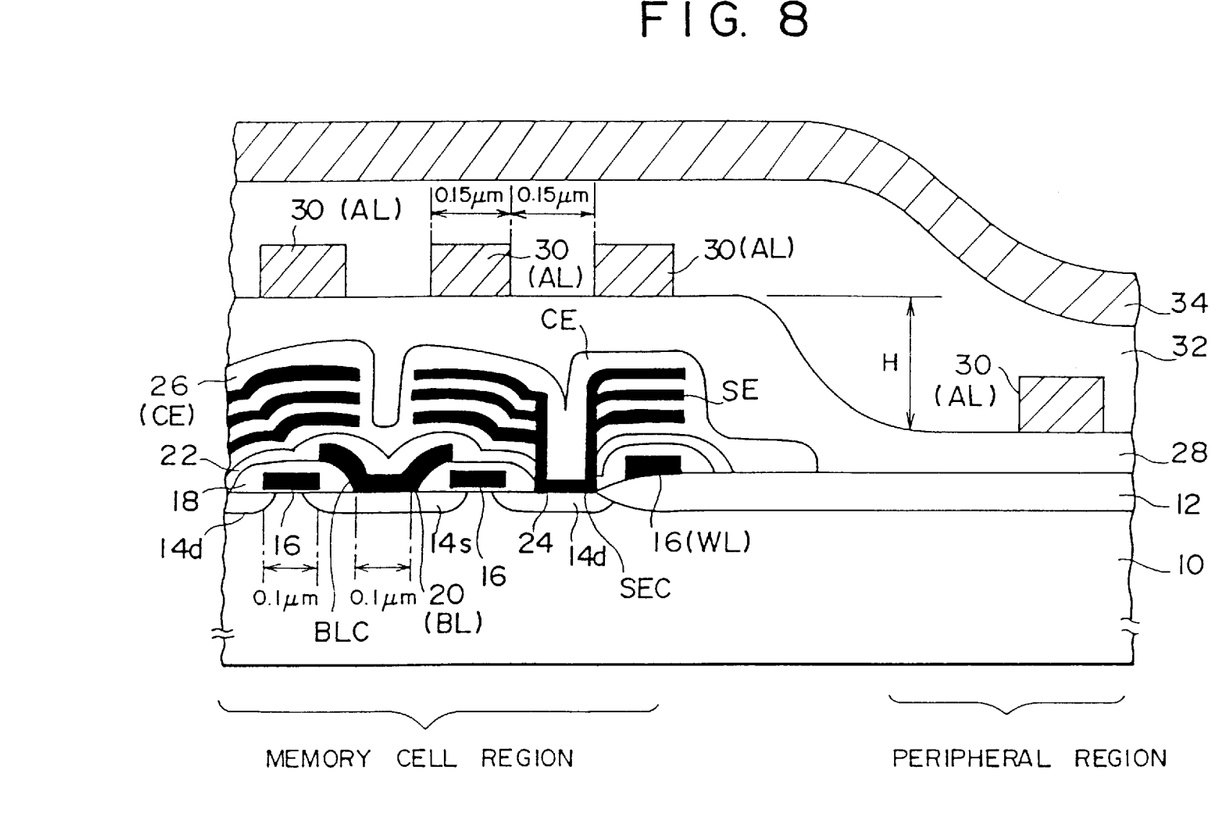
FIG. 8 is a diagram showing the essential part of the dynamic random access memory of FIGS. 6 in the cross sectional view.

FIG. 8 shows the cross sectional view of the structure of FIG. 7 along a line 8—8'.

Referring to FIG. 8, it will be noted that there are formed diffusion regions 14d and 14s in the silicon substrate 10 respectively in correspondence to the source and drain of the transfer gate transistor. Between the diffusion regions 14d and 14s, there is formed a channel region of carriers, and a polysilicon strip 16 is provided on the substrate 10 in correspondence to the channel region as the word line WL. The polysilicon strip 16 is separated from the surface of the substrate by a gate oxide film and is buried under the insulation layer 18. It should be noted that the contact hole BLC is provided on the insulation layer 18, and a polysilicon strip 20 acting as the bit line BL establishes a contact with the exposed diffusion region 14s. Thereby, the polysilicon (or polycide) strip 20 is provided above the polysilicon strip 16.

The polysilicon strip 20 is further embedded in an insulation layer 22, and the stacked fin memory cell capacitor SE is provided above the insulation layer 22 in contact with the diffusion region 14d via the contact hole SEC. It should be noted that the contact hole SEC is formed through the insulation layer 18 as well as through the insulation layer 22. As illustrated, the stacked fin memory cell capacitor includes a number of fin electrodes SE stacked with each other, with an insulation layer (not shown) covers the surface of the fin as well as the surface of the opposed electrode CE (26) that fills the space between the fin electrodes.

The electrodes SE and CE forming the stacked fin memory cell capacitor are embedded under the insulation layer 28, and aluminum strips 30 acting as the shunt word line AL extends on the upper major surface of the insulation layer 28. Further, the aluminum strips 30 are embedded in another insulation layer 32 and an aluminum layer 34 is provided on the upper major surface of the layer 32 as another signal line such as the signal line for the column select signal.

From the cross sectional diagram of FIG. 8, it will be noted that there appears a step having a step height H in the upper major surface of the insulation layer 28 in correspondence to the boundary between the memory cell array region and the peripheral region. In the device of the present invention, the height H is optimized by reducing the capacitance of the memory cell capacitor such that the exposure of the shunt conductor AL is achieved successfully both in the memory cell region and in the peripheral region. Such a reduction in the capacitance of the memory cell capacitor is of course compensated by the reduction of the extension of the bit line in each memory cell sub-array as already mentioned.

Next, the process for optimizing the height H and hence the capacitance of the memory cell capacitor will be described.

When a specification of the dynamic random access memory to be fabricated is given, the design rule for the word lines WL and the bit lines BL is determined first. It should be noted that the word lines WL and the bit lines BL have to be provided to avoid the contact holes BLC or SEC and are required to be formed with a very stringent design rule. In the case of the 1 Gbit DRAMs, the word line WL and the bit line BL have to be formed with the design rule of 0.1 $\mu$m as shown in FIG. 8.

In FIG. 8, the word lines WL are formed on a substantially flat surface with the design rule of 0.1 $\mu$m, while the shunt word lines AL are formed on the stepped surface with a less stringent design rule of 0.12 $\mu$m. It should be noted that the shunt word lines WL are not necessarily formed into a complex pattern but may be formed as parallel straight strips in the plan view, contrary to the word lines WL that have to be formed to avoid various contact holes.

Figure 9:
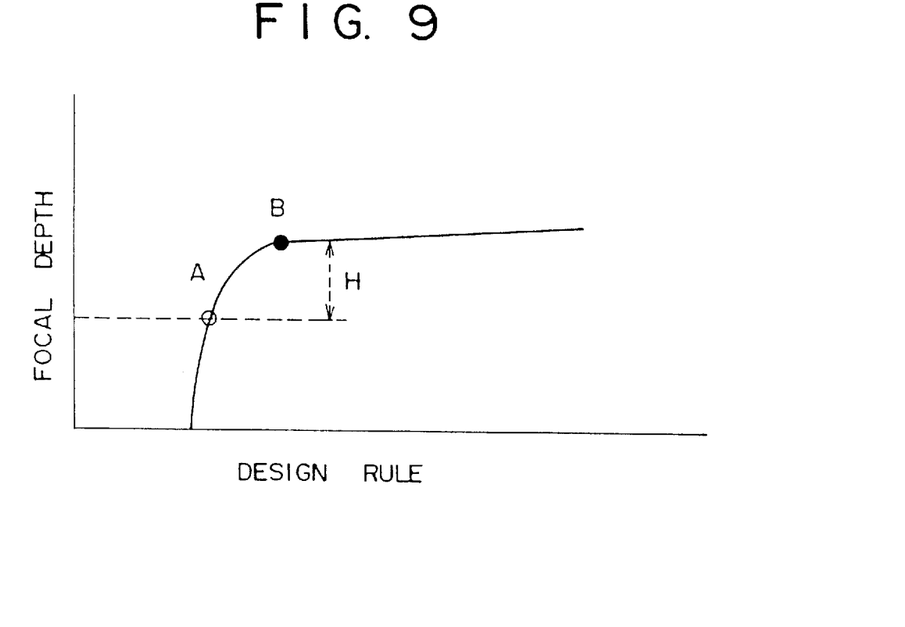
FIG. 9 is a diagram showing the relationship between the focal depth and the resolution that is achieved by a conventional optical exposure system.

FIG. 9 shows the relationship between the focal depth and the design rule for an optical exposure system used for exposing the memory devices. As can be seen in FIG. 9, the focal depth decreases steeply with increasing strictness of the design rule and reaches zero at the resolution limit of the optical exposure system. The focal depth at a point A, which corresponds to the design rule for the word lines WL, becomes smaller than the focal depth at a point B that corresponds to the design rule for the exposure of the shunt word lines AL, wherein there is a difference H in the focal depth between the points A and B as illustrated in FIG. 9. It should be noted that the step height H of FIG. 8 has to be set equal to or smaller than the difference of the focal depth H shown in FIG. 9.

In FIG. 9, the point A is located near the resolution limit, and hence the exposure at the point A tends to become unstable. In order to overcome this problem, it is necessary to increase the numerical aperture N.A. when exposing the word lines WL. It should be noted that the resolution of an optical exposure system is given as $$\text{resolution}^{60} \propto \lambda / \text{N.A.} \tag{7}$$

where $\lambda$ represents the wavelength of the optical radiation that is used for the exposure. On the other hand, it is known that the focal depth of such an optical exposure system is given as $$\text{focal depth}^\alpha \propto \lambda / (\text{N.A.})^2. \tag{8}$$

Therefore, if $\lambda$ and/or N.A. can be changed in response to the design rule used for the exposure, the focal depth of each pattern can be represented in terms of the resolution as $$\begin{aligned}\text{focal depth} &\propto (\text{resolution})^2 \\ &\propto (\text{design rule})^2.\end{aligned} \tag{9}$$

Eqs.(7), (8) and (9) indicate that the focal depth, the design rule and the numerical aperture are related with each other and that there exists an optimum numerical aperture value in correspondence to the design rule that is used for the exposure of the word lines WL or the shunt word lines AL. For example, the design rule for the shunt word lines AL is less strict as compared with the design rule for the word lines WL. Thereby, it is possible to increase the focal depth for the exposure of the shunt word lines AL by decreasing the numerical aperture as compared with the case of the exposure of the word lines WL. On the other hand the exposure of the word lines WL can be achieved by increasing the numerical aperture N.A. significantly as compared with the exposure of the shunt word lines AL.

Figure 10:
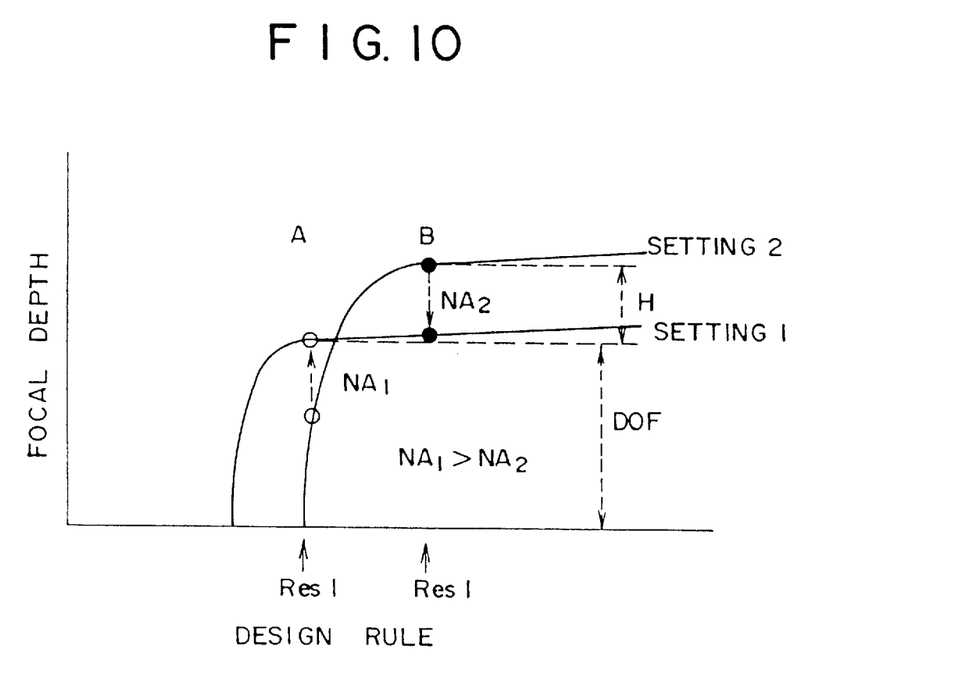
FIG. 10 is a diagram showing the switching of the numerical aperture in the optical exposure system that is employed in the fabrication of the device of the present embodiment.

FIG. 10 shows the two settings of the optical exposure system used for exposing the device pattern of FIG. 7. In the setting 1, the numerical aperture is set to a first value $NA_1$ while in the setting 2, the numerical aperture is set to a second value $NA_2$, wherein it is assumed that there holds a relationship $NA_1 > NA_2$. There, the setting 1 is used for the exposure of the word lines WL and the bit lines BL, while the setting 2 is used for the exposure of the shunt word lines AL. It should be noted that there appears a difference H in the focal depth in the setting 1 and in the setting 2, wherein the step height H of FIG. 8 is set equal to or smaller than the difference of focal depth H of FIG. 10. From FIG. 8, it will be noted that the step height H corresponds to the height of the memory cell capacitor SE. Thus, the difference in the focal depth H of FIG. 10 is related to the height of the stacked memory cell capacitor SE. In other words, the relationship of FIG. 10 determines the optimum height and hence the optimum capacitance of the memory cell capacitor. The description of the optical exposure system that can change the numerical aperture will be made later.

Summarizing the above argument, the difference H of the focal depth in the two settings is given as $$H = (\text{focal depth of WL}) \times \{(\text{design rule of AL}/\text{design rule of WL})^2 - 1\} \quad (10)$$

where Eq.(9) is used for the derivation of Eq.(10).

When the design rule of the shunt word line AL is set to 0.12 μm and the design rule of the word line WL set to 0.1 μm, with the focal depth for the exposure of the word line WL set to 0.4 μm, the parameter H representing the optimum height of the memory cell capacitor is obtained as 0.17 μm. Here, the use of the radiation of the ArF excimer laser is assumed. It should be noted that the focal depth for the exposure of the shunt word line AL is obtained in this case as 0.57 μm (=0.4×(0.12/0.10)²). In the case of designing a 256 Mbit DRAMs with the design rule for the word line WL of 0.2 μm and the design rule for the shunt word line AL of 0.24 μm, on the other hand, the optimum height of the memory cell capacitor is obtained as 0.26 μm, where the use of KrF excimer laser is assumed and the focal depth for exposing the word line WL is assumed to be 0.6 μm.

In the actual fabrication of a 1 Gbit DRAM, an optical exposure system that uses the ArF excimer laser (wavelength of 0.193 μm) is used for the optical source in combination with a phase shift mask. The optical system has a variable focal depth that is set to 0.4 μm for the exposure of the word lines WL. When exposing the shunt word lines AL, on the other hand, the focal depth is set to 0.57 μm in correspondence to the design rule of 0.12 μm as already mentioned.

In determining the actual height H, the upper limit of the height of the memory cell capacitor is set to be smaller than 0.17 μm by considering the tolerance of about 0.4 μm that may occur in relation to the deviation in the flatness of the substrate and in relation to the error at the time of the focusing of the optical beam.

While observing the constraint determined as above, the stacked memory cell capacitor SE is formed by stacking by stacking three fin electrodes each having a thickness of 20 nm with a mutual separation of 20 nm. This construction results in the memory cell capacitor having the height of 0.12 μm that is substantially smaller than the upper limit value of 0.17 μm. The memory cell capacitor thereby has an aspect ratio of 1.2 in view of the lateral size that is set to 0.1 μm in correspondence to the design rule. Further, a dielectric film of 4 nm thickness (not shown in FIG. 8) is provided on each fin of the memory cell capacitor. With this construction, the memory cell capacitor has a capacitance of 7 fF.

When fabricating a 256 Mbit DRAM, on the other hand, an optical radiation having a wavelength of 0.248 μm is produced from a KrF excimer laser, and the word line WL is exposed with the design rule of 0.2 μm. On the other hand, the shunt word line AL is exposed with the design rule of 0.24 μm. The memory cell capacitor is formed by stacking three fin electrodes each having the thickness of 20 nm with each other with a mutual separation of 20 nm, similarly to the case of the 1 Gbit device. Thereby, the total height of the memory cell becomes 0.12 μm that is identical with the memory cell capacitor for the 1 Gbit device. The difference is that the lateral size of the memory cell capacitor is set to 0.2 μm in correspondence to the design rule used for the fabrication of the 256 Mbit DRAM, and the memory cell capacitor now has the capacitance of 18 fF. Here, the thickness of the dielectric film is assumed to be 5 nm. It should be noted that the capacitance of 7 fF or 18 fF is significantly smaller than the conventional capacitance value of the memory cell capacitor that has been set to about 30 fF.

Next, the process for determining the optimum number of memory cells that are connected to a single bit line will be described. In this process, Eq.(2) described previously is used.

Assuming the supply voltage $V_{CC}$ of 1.5 volts, the voltage change that appears on the bit line at the time of reading data is represented as $$_\Delta V = (1500 \text{mV}/2)/(1 + C_B/C_S).$$

In order to obtain a reliable reading operation of the sense amplifier, it is necessary to secure the signal voltage $_\Delta V$ of at least 100 mV. Thus, the above equation is written as $$100 \text{ mV} = (1500 \text{mV}/2)/(1 + C_B/C_S).$$

When the memory cell capacitor $C_S$ is set to 7 fF as in the case of the 1 Gbit DRAM, the bit line capacitance $C_B$ is determined to be 45.5 fF. On the other hand, the bit line capacitance per memory cell, $C_b$, is represented as 0.3 fF when the design rule of 0.1 μm is employed. Thereby, the maximum number $N_{MAX}$ of the memory cells that are connected to one bit line is determined as $N_{MAX} = 45.5/0.3 = 152$. By choosing a number that is represented in terms of a power of the numeral two ($2^n$) and which is closest to 152, one obtains a number of 128. Thus, the upper limit number of the memory cells connected to one bit line is determined to be 128. In this case, the signal voltage $_\Delta V$ of about 115 mV is secured.

When the memory cell capacitor $C_S$ is set to 18 fF in the 256 Mbit DRAM, the bit line capacitance $C_B$ is determined to be 117 fF, and the maximum number $N_{MAX}$ of the memory cells is obtained as 195 ($N_{MAX}=195$). By choosing the number that is represented as $2^n$ and closest to 195, one again obtains the value of 128.

Summarizing the above, the present invention proposes a method for designing a DRAM having a large integration density including the steps of:

(a) determining the design rule with respect to the word lines WL and the bit lines BL and further with respect to a pattern such as the shunt word line AL that extends from the memory cell array region to the peripheral region across the stepped boundary formed between the former and the latter;

(b) determining the step height H of the stepped boundary based upon the design rule determined in the step (a);

(c) determining the capacitance $C_S$ of the memory cell capacitor based upon the step height H determined in the step (b);

(d) determining a parasitic capacitance $C_B$ of the bit line BL such that a ratio of the parasitic capacitance $C_B$ to the capacitance $C_S$ of the memory cell is smaller than a predetermined factor of about 6; and (e) determining the number $N_{MAX}$ of the memory cells that are connected to one bit line based upon the parasitic capacitance of $C_B$ of the bit line determined in the step (d).

In the step (b), the relationship shown in Eq.(10) is used for determining the step height H and hence the height H of the memory cell capacitor. In applying Eq.(10), it is necessary to determine the focal depth for exposing the word lines WL, the design rule for the word lines WL and the bit lines BL and the design rule for the shunt word lines AL. It should be noted that the step (b) is equivalent to determine the numerical aperture N.A. of the optical exposure system for the exposure of the word line WL and for the exposure of the shunt word line AL. See FIG. 10.

In the step (c), the lateral size and hence the area of the memory cell capacitor is determined based upon the design rule that is used for exposing the word line WL and the bit line BL. It should be noted that the exposure of the fin electrode of the memory cell capacitor is achieved with the most stringent setting of the design rule.

In the step (d), the parasitic capacitance $C_B$ of the bit line is determined based upon Eq.(2) by substituting the capacitance $C_S$ such that a sufficient signal voltage $_\Delta V$ is obtained on the bit line.

In the step (e), the parasitic capacitance per memory cell, $C_b$, is obtained based upon the design rule for the bit lines BL, and the number of the memory cells is obtained by dividing the parasitic capacitance $C_B$ by the parameter $C_b$. Further, a convenient number that may be a number represented as $2^n$ and is close to the number thus calculated may be used, in place of the calculated number. In the step (b), the step height and hence the height H of the memory cell capacitor may be set below a limiting value in view of the fabrication tolerance.

Next, the optical exposure system used for the fabrication of the DRAMs in the present invention will be described with reference to FIG. 11.

Figure 11:
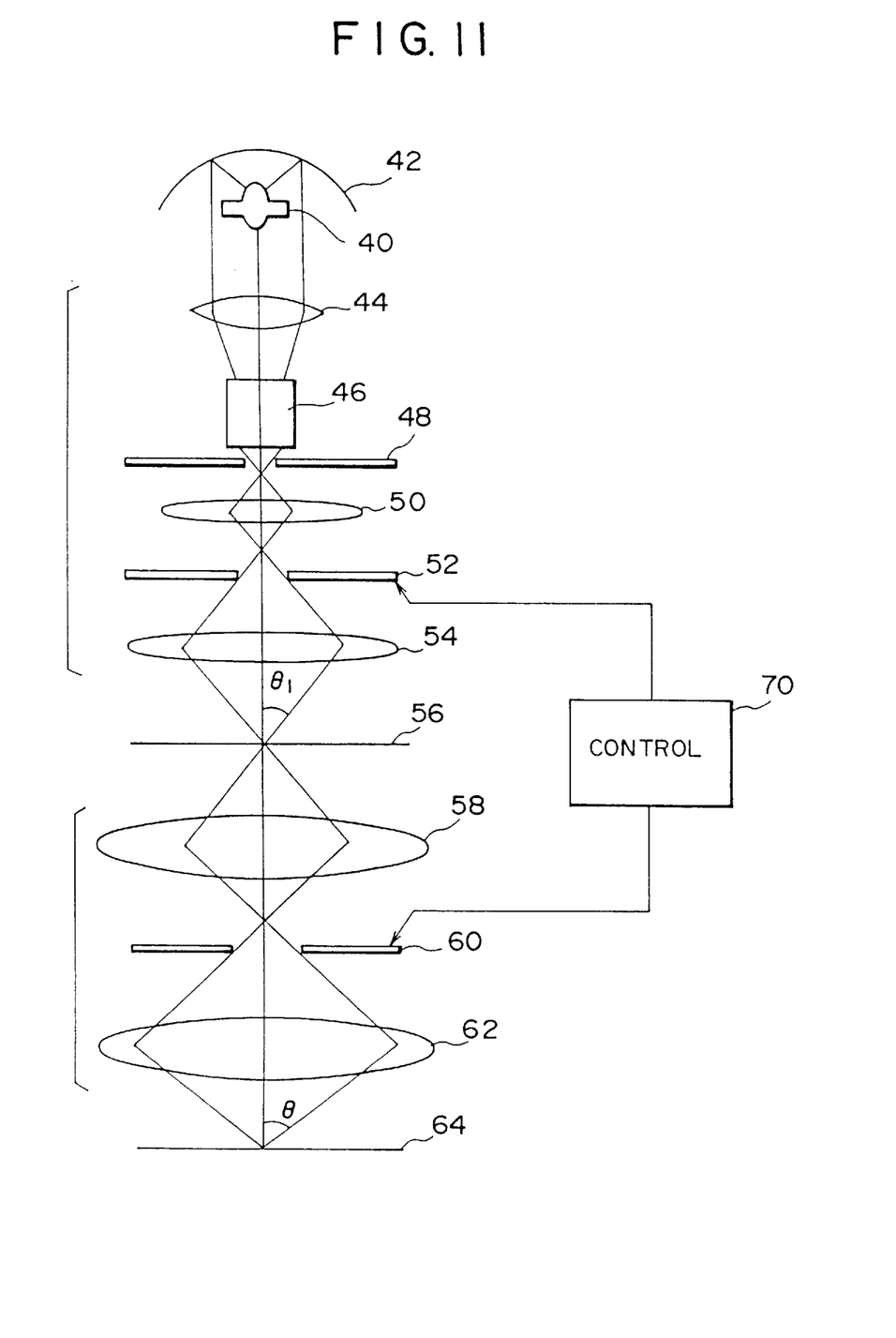
FIG. 11 is a diagram showing the construction of the optical exposure system that is employed for the fabrication of the dynamic random access memory in the present invention.

Referring to FIG. 11, there is provided an optical source 40 that may be the ArF excimer laser or the KrF excimer laser. The optical beam produced by the optical source 40 is converted to a parallel optical beam by an elliptical mirror 42 and passed through a first stage optical system that includes lenses 44, 46, 50 and 52, wherein the lens 46 is a fly-eye lens. Between the lens 46 and the lens 50, there is provided a first aperture 48 while there is provided a second aperture between the lens 50 and the lens 54. The optical beam is thereby focused on a reticle mask 56 by the lens 54. As usual in the art, a phase shift mask (not shown) is provided on the reticle mask for minimizing the diffraction of the optical beam at the edge of the reticle pattern.

Upon passage through the reticle mask 56, the optical beam is shaped according to the device pattern formed on the mask 56 and is focused on a substrate 64 by lenses 58 and 56 that form a second stage optical system. Between the lens 56 and 58, there is provided an aperture plate 60 for controlling the numerical aperture of the optical system.

It is well known that the numerical aperture of a lens is given as N.A.=sinθ, where θ represents the maximum angle of the optical beam that is focused on an object by the lens with respect to the optical axis. Thus, by controlling the size of the aperture in the aperture plate 60, one can control the angle e and hence the numerical aperture of the lens 62. When changing the numerical aperture N.A., it is necessary to change the numerical aperture of the condenser lens 54 simultaneously for avoiding the change of the phase dispersion σ, which is given as $$\sigma = (N.A. \text{ of lens } 54)/\{(1/m)\}$$
$$= \sin\theta_1/\{(1/m)\sin\theta\}.$$

Thus, there is provided a controller 70 that controls the aperture plate 52 and the aperture plate 60 simultaneously. By using the optical exposure system of FIG. 11, one can achieve the exposure while changing the numerical aperture as shown in FIG. 10. Here, it should be noted that the change of the numerical aperture is more preferable than the change of the wavelength of the optical radiation used for the exposure. When the wavelength of optical radiation is changed, not only the optical source is changed but the photoresist has to be changed. Thereby, the exposure of the word lines WL and the shunt word lines AL by the same optical exposure system becomes difficult.

Figure 12:
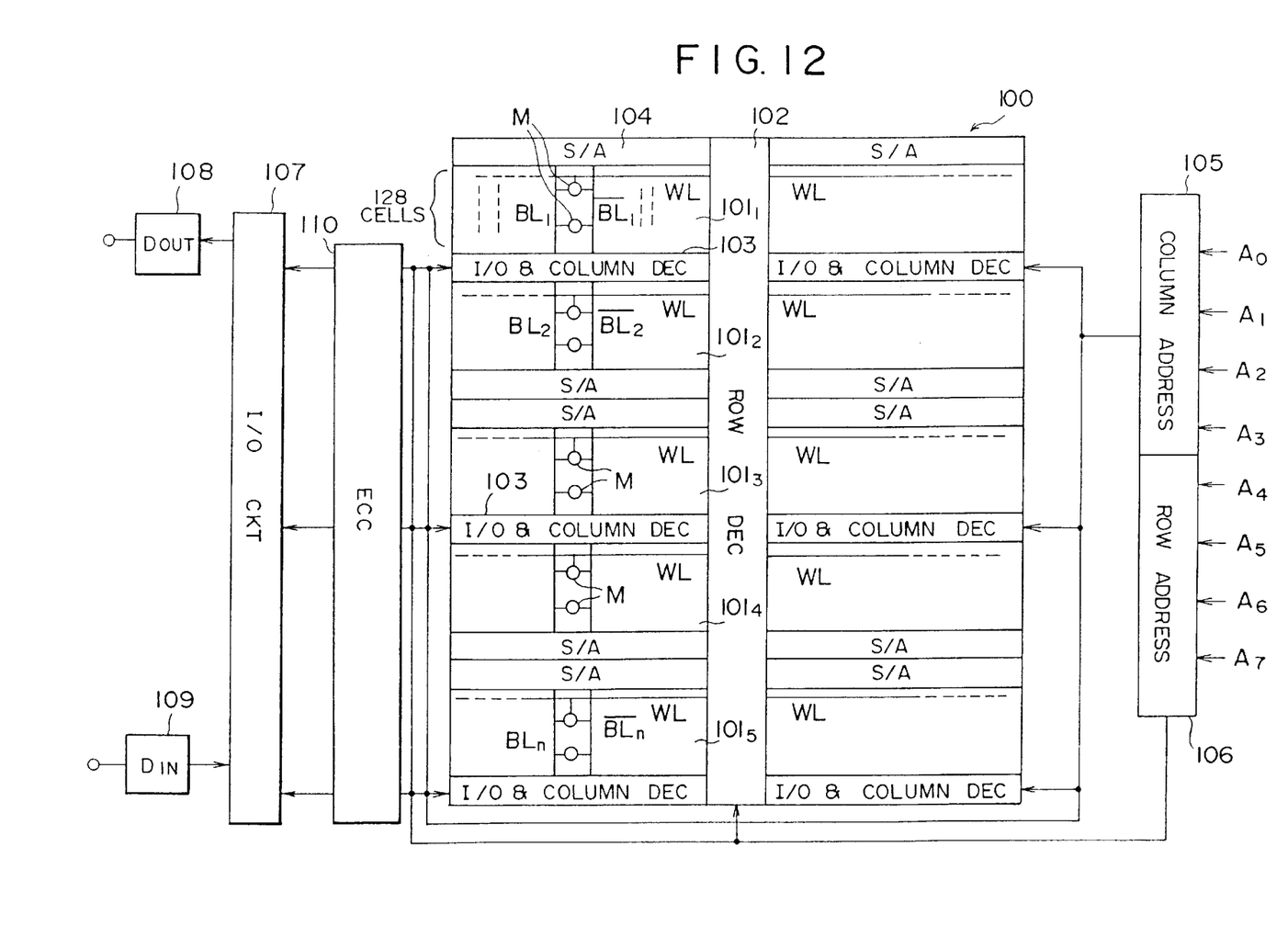
FIG. 12 is a block diagram showing the construction of the dynamic random access memory according to a second embodiment of the present invention.

FIG. 12 shows a second embodiment of the DRAM according to the present invention.

In the device of the present invention, it will be noted that there may occur a problem of so-called soft error caused by the alpha particles that are released from the radioactive element contained in the insulation material. As the capacitance of the memory cell is very small in the DRAM of the present invention, the probability that the device operates erroneously is increased substantially. Of course there are applications, as in the video memories wherein the erroneous operation of a single memory cell does not cause a substantial problem. In such applications, the construction of FIG. 6 can be used without modification.

On the other hand, there are applications as in the logic processors wherein the erroneous operation of the DRAM is detrimental. In such a case, an error check code (ECC) circuit 110 may be provided between the memory cell array 100 and the input/output interface circuit 107. There, the ECC circuit 110 achieves a parity check operation for the data that have been read out from the memory cells and corrects the data if an error is present. As the detailed construction of the ECC circuit is disclosed for example in Mano et al., 1983 IEEE International Solid-State Circuit Conference, Digest of Technical papers, pp.234–235, which is incorporated herein as reference, further description will be omitted.

Further, the present invention is not limited to the embodiments described heretofore, but various variations and modifications may be made without departing from the scope of the invention.

What is claimed is:

1. A method for forming first and second conductive lines in a dynamic random access memory (DRAM), comprising:

setting an optical exposure system to a first focal depth;

patterning a first conductive line at a first level in the dynamic random access memory, using the first focal depth set for the optical exposure system;

setting the optical exposure system to a second focal depth;

patterning a second conductive line at a second level in the dynamic random access memory, using the second focal depth set for the optical exposure system, the second level having a height above the first level due at least in part to stacked memory cell capacitors formed in the dynamic random access memory, the height between the first and second levels being less than or equal to a difference between the first focal depth and the second focal depth.

2. A method as claimed in claim 1, wherein the first conductive line includes a bit line.

3. A method as claimed in claim 2, wherein said patterning of the first conductive line includes patterning the first conductive line to couple with a number of stacked memory cell capacitors, the number of the stacked memory cell capacitors being determined based on at least the height of the second level above the first level, and a parasitic capacitance of the first conductive line.

4. A method as claimed in claim 1, wherein the first conductive line includes a word line.

5. A method as claimed in claim 1, wherein the second conductive line includes a shunt word line.

6. A method as claimed in claim 5, wherein the dynamic random access memory includes a peripheral region having the first level and a memory cell array region having the second level, the stacked memory cell capacitors being formed in the memory cell array region, wherein a plurality of second conductive lines are patterned using the second focal depth, and wherein said patterning of the second conductive line includes patterning the second conductive lines on the memory cell array region, on the peripheral region and on a boundary region between the memory cell array region and the peripheral region.

* * * * *

UNITED STATES PATENT AND TRADEMARK OFFICE
CERTIFICATE OF CORRECTION

PATENT NO.: 5,874,332
DATED : February 23, 1999
INVENTOR(S): Taiji EMA

It is certified that error appears in the above-identified patent and that said Letters Patent is hereby corrected as shown below:

On the title page, [73] Assignee, change "Kanagawa" to --Kawasaki--.

Col. 4, line 18, change "Åand" to --Å and--;
line 55, after "line" insert --,--.

Col. 5, line 9, delete ",".

Col. 10, line 42, change the equation to --resolution $\propto \lambda/N.A.$--;
line 48, change the equation to --focal depth $\propto \lambda/(N.A.)^2$--;
line 66, after "hand" insert --,--.

Signed and Sealed this

Thirty-first Day of August, 1999

Attest:

Q. TODD DICKINSON

*Attesting Officer*   *Acting Commissioner of Patents and Trademarks*